United States Patent [19]

David et al.

[11] 4,292,594
[45] Sep. 29, 1981

[54] METHOD AND APPARATUS FOR CARRIER REGENERATION AND SYNCHRONOUS AMPLITUDE DEMODULATION

[75] Inventors: Jacques David, Lannion; Hubert Mionet, Perros-Guirec, both of France

[73] Assignee: Compagnie Industrielle des Telecommunications Cit-Alcatel, Paris, France

[21] Appl. No.: 68,439

[22] Filed: Aug. 21, 1979

[30] Foreign Application Priority Data

Aug. 30, 1978 [FR] France .................................. 78 24994

[51] Int. Cl.³ .............................................. H03D 1/00
[52] U.S. Cl. ...................................... 329/50; 331/17; 331/23; 455/204
[58] Field of Search ......................... 329/50, 122, 124; 331/17, 18, 23, 25; 455/204, 260; 358/23–25, 158

[56] References Cited

U.S. PATENT DOCUMENTS

| | | | |
|---|---|---|---|
| 3,577,081 | 5/1971 | Schulz | 332/44 X |
| 3,849,730 | 11/1974 | Ho | 329/50 X |
| 4,091,410 | 5/1978 | Citta | 329/50 X |

*Primary Examiner*—Siegfried H. Grimm
*Attorney, Agent, or Firm*—Roland Plottel

[57] ABSTRACT

The invention relates to a method of regenerating the modulation carrier wave of an original modulated signal (SL) which has symmetrical frequency components about the carrier. A phase discriminator (D1) which receives two image signals (SL, S11) of the original signal controls the frequency of a local oscillator (OL), the frequency spectrum of one of the image signals being inverted with respect to that of the original signal and the difference in frequencies between these two image signals being twice that between the local carrier and the carrier of the original signal. Application to the synchronous demodulation of a television signal.

15 Claims, 4 Drawing Figures

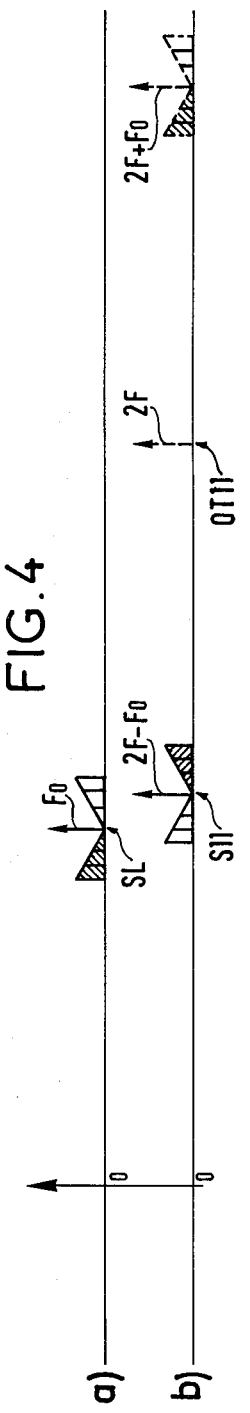
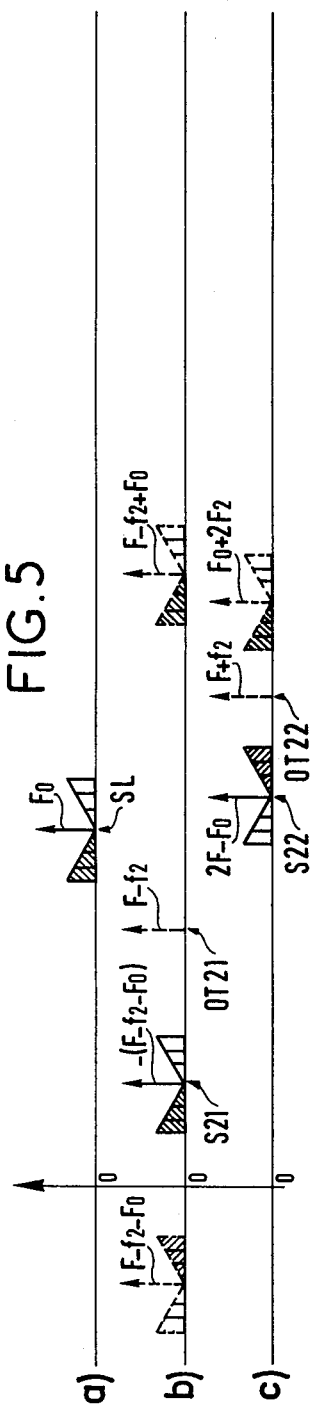
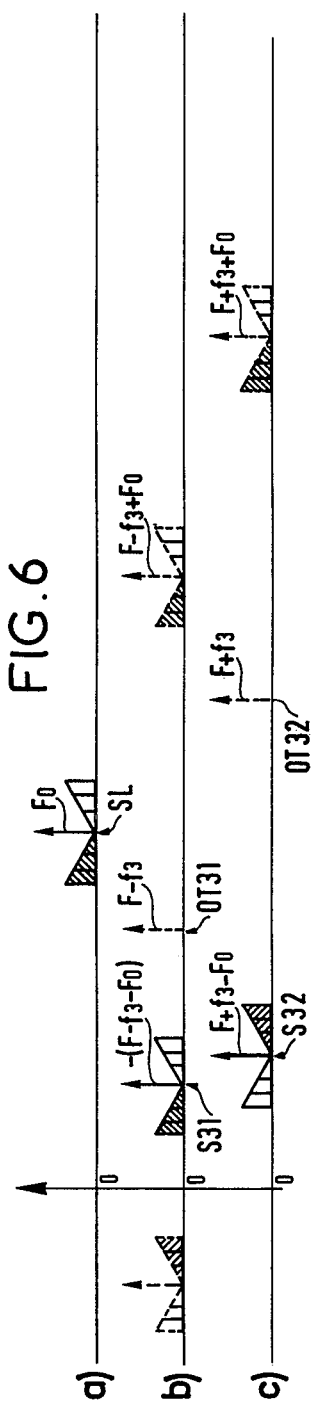

METHOD AND APPARATUS FOR CARRIER REGENERATION AND SYNCHRONOUS AMPLITUDE DEMODULATION

The invention relates to a method of regenerating the modulation carrier wave of a modulated signal which has, at least in the neighbourhood of the carrier frequency, a frequency spectrum which is essentially symmetrical about the carrier frequency.

The invention also relates to apparatus for implementing the method and applies in particular to synchronous demodulation of modulating signals.

One known solution for recovering the carrier of a modulated signal, when the signal has at least a vestigial carrier, is to use a voltage-controlled variable-frequency local oscillator to generate a local carrier, a phase discriminator to which both the modulated signal and the local carrier are applied, and a low-pass filter connected between the output of the phase discriminator and a control input of the local oscillator. This known solution is described in many works; by way of example, reference may be made to chapter 3, page 42 of A. Blanchard's book "Phase-locked loops: application to coherent receiver design" published by John Wiley and Sons in New York in 1975.

Although such a solution may be suitable when the frequencies of the original modulated signal are not very close to the frequency of the modulation carrier, this is not so in the contrary case. Indeed there is then a great danger of the oscillator latching onto other frequencies contained in the original signal and close to the carrier frequency instead of onto the carrier frequency itself.

The invention provides a new solution to the problem of carrier recovery. Preferred embodiments of the invention are particularly suitable in the case where the frequencies of the modulated signal are very close to that of the carrier; this is found in practice when the modulating signal is a television signal, for example.

The present invention provides a method of recovering the modulation carrier wave of a modulated signal whose frequency spectrum includes components whose frequencies are symmetrical in pairs about the carrier frequency, said method including the following operations:

generating a local carrier (F) at a controllable frequency;

deriving, where necessary, an "original" signal (SL) from the said modulated signal, such that the frequency spectrum of the original signal is constituted substantially entirely by a frequency component at the carrier frequency and modulation components arranged symmetrically in pairs about the carrier frequency;

using the local carrier in conjunction with modulation means and filtering means to generate two image signals from the "original" signal such that the frequency spectrum of one of the image signals is inverted about its central frequency with respect to the frequency spectrum of the other of the image signals, and such that the frequency difference between the central frequencies of the image signals is proportional to the frequency difference between the frequency of the local carrier and the frequency of the modulation carrier;

performing a step of phase discrimination between the said image signals; and controlling the frequency of the local carrier by the signal which results from the discrimination after removal of the high frequencies.

In a first embodiment, the two signals which are made to beat together are the original signal and a signal which results from a transposition of the original signal by a transposition wave at twice the frequency of the carrier delivered by the local oscillator.

In a second embodiment, the two signals which are made to beat together are the original signal and a signal which results from two successive transpositions of the original signal by two respective transposition waves whose frequencies are equidistant from the frequency of the carrier delivered by the local oscillator.

In a third embodiment, both of the signals which are made to beat together are the results of transpositions of the original signal, the frequencies of the waves used for these two tranpositions being equidistant from the carrier delivered by the local oscillator.

It can be considered that in a way, the first embodiment is a particular case with respect to the others; it is the equivalent of taking two transposition waves of which has zero frequency and the other of which has a frequency twice that of the local oscillator.

The present invention also provides apparatus for performing the above method.

With reference to the accompanying schematic figures, a non-limiting description of the invention will be given hereinbelow. It must be understood that without going beyond the scope of the invention, the components described and illustrated can be replaced by other components which performs the same technical functions. When a component is illustrated in several figures, it is designated therein by the same reference symbol.

FIGS. 4, 5 and 6 are spectrum diagrams corresponding respectively to the said three embodiments.

The non-limiting case described hereinafter concerns an original signal which is generated by vestigial sideband amplitude modulation of a carrier of frequency $F_0$ by a television signal.

To give a clear idea, the frequencies brought into play are, for example: the nominal frequency $F_0$ of the modulation carrier—20,397 kHz—and the frequency spectrum of the original signal ranging from $20,397 - 5,500$ kHz to $20,397 + 500$ kHz and being constituted by frequency components which are separated by multiples of 50 Hz from the frequency component which corresponds to the carrier.

Figure 1:
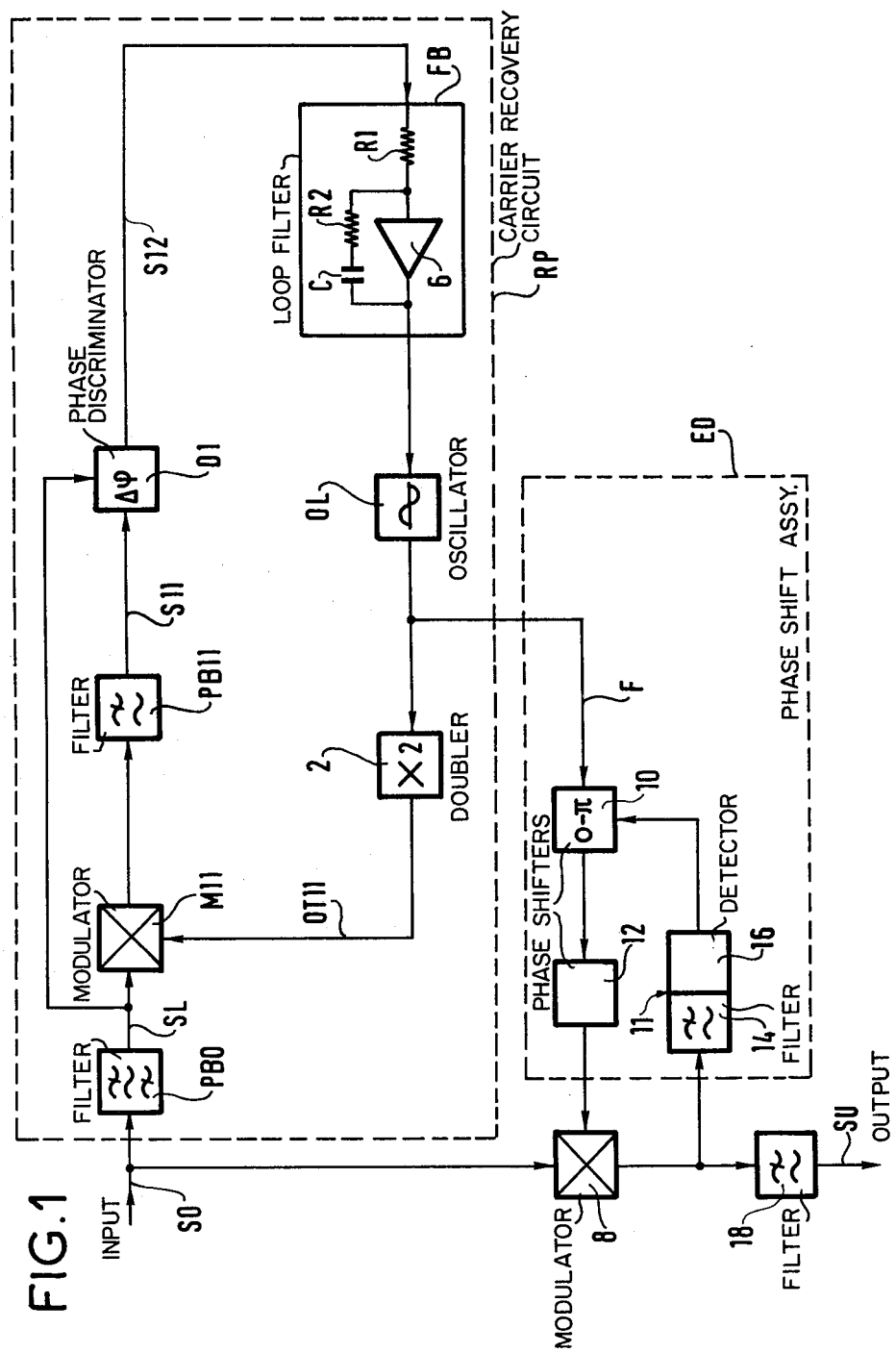
FIGS. 1, 2 and 3 are block diagrams of synchronous demodulators of an amplitude modulated signal, said demodulators including carrier recovery circuits in accordance with the invention. They illustrate respectively the three above-mentioned embodiments.
Figure 2:
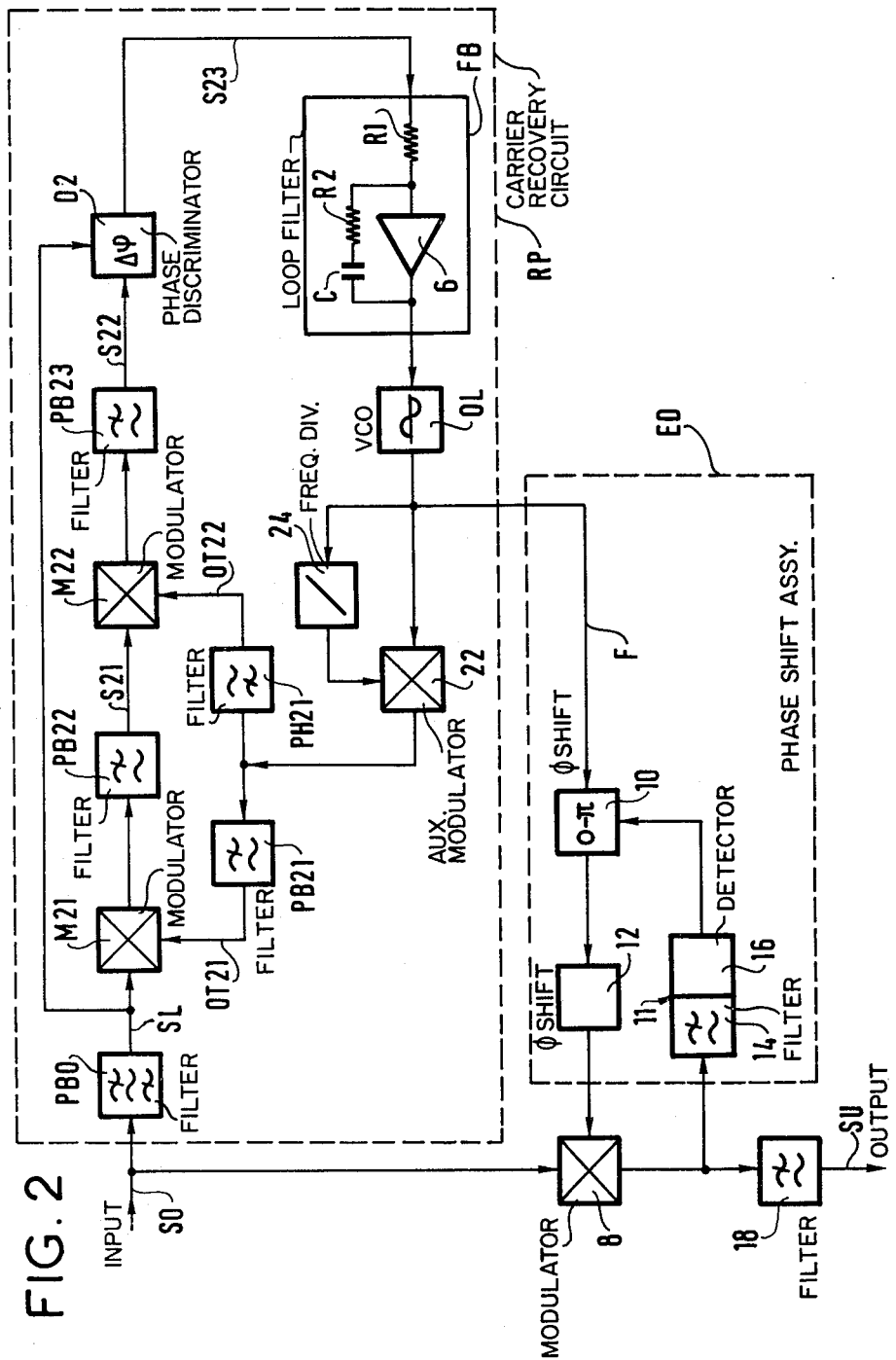
Figure 3:
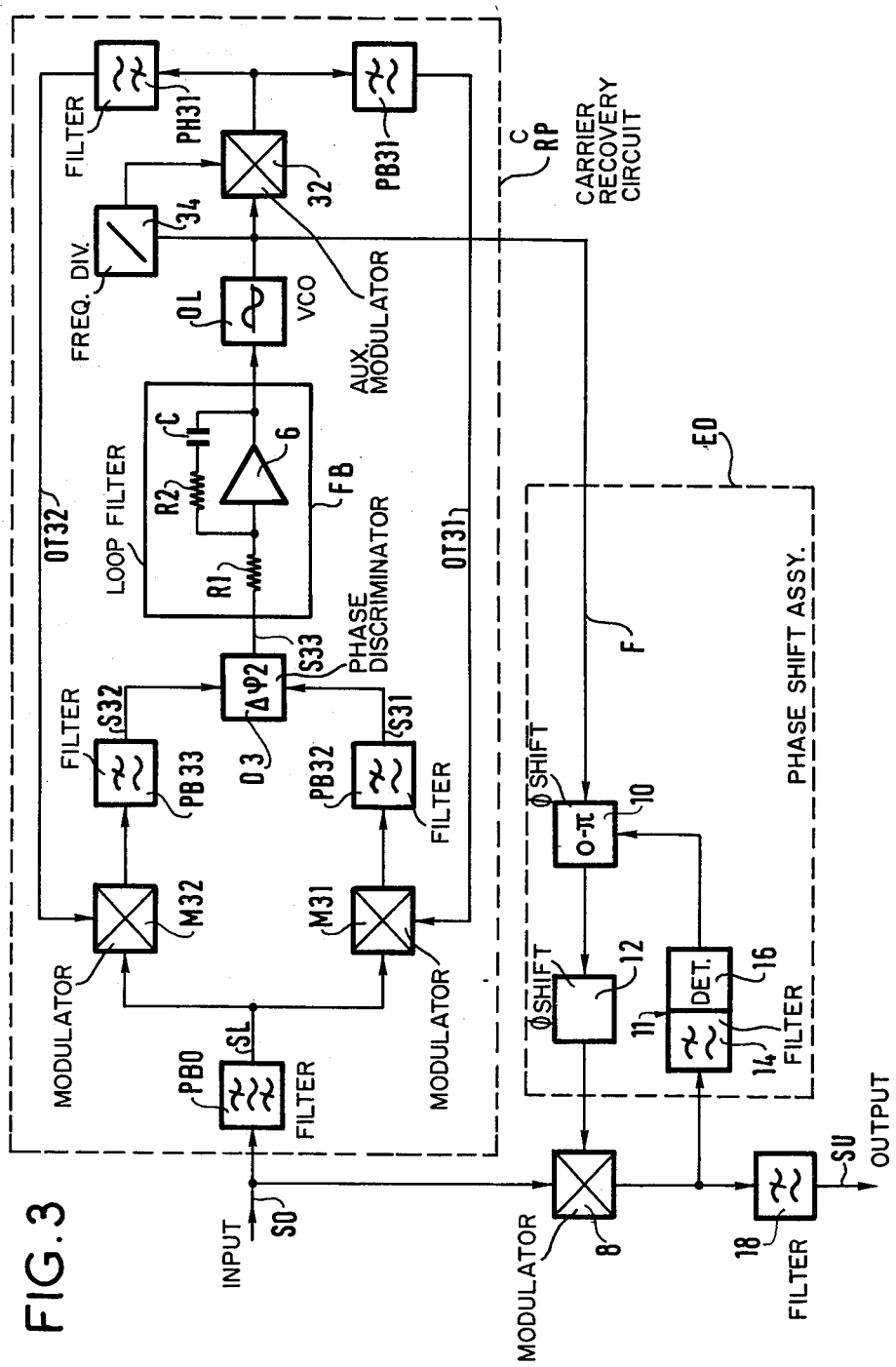

The demodulators illustrated in FIGS. 1, 2 and 3 each include a carrier recovery circuit RP in accordance with the invention at whose input the original modulated signal SO is applied and which delivers in response a local carrier of frequency F. The modulated signal SO is actually demodulated by a modulator 8 which receives the signal SO and the local carrier via a phase shifter assembly ED whose function will become more clearly apparent from the description hereinbelow, and followed by a low-pass filter 18 at whose output the useful demodulated signal SU is obtained.

In each of the carrier recovery circuits, the local carrier, of frequency F and whose phase is shifted by $\phi$ from the modulation carrier, is generated by a voltage-controlled variable-frequency local oscillator OL which is included in a phase-locked loop controlled by an original signal SL of narrow frequency spectrum resulting from the signal SO after its frequency spectrum has been limited by a band-pass filter PBO to a frequency band about the frequency $F_0$ of the modulation carrier. In the case in question, by way of numerical example, the band-pass filter which is constituted for example by a quartz filter has a central frequency of 20,397 kHz and a bandwidth of about 20 kHz. The frequency F of the local oscillator varies in a ±500 Hz range on either side of 20,397 kHz. The frequency of the modulation carrier does not vary by more than 500 kHz from its nominal value.

The three carrier recovery circuits of the demodulators illustrated in FIGS. 1, 2 and 3 differ by the structure of their phase-locked loops.

In the circuit illustrated by FIG. 1, the local carrier F, generated by the local oscillator OL is applied to a frequency doubler 2 which, in response, delivers a wave OT11 of frequency 2F. The narrow frequency spectrum signal SL is transposed by the wave OT11 by applying the frequency spectrum to a modulator M11 which also receives the wave OT11. A low-pass filter PB11 placed at the output of the modulator M11 selects the lower modulation band and supplies a signal S11. A phase discriminator D1 makes the narrow frequency spectrum signal SL beat with the signal S11 delivered by the low-pass filter PB11. The resulting beat signal S12 is applied via a loop filter FB to control the local oscillator OL.

The loop filter FB is constituted for example by an operational amplifier 6 connected as a low-pass filter and equipped for this purpose with an input impedance R1 and a feedback impedance formed by a capacitor C in series with a resistor R2. The values, namely, R1 and R2, of the input and feedback impedances are chosen so that the ratio R2/R1 is at least equal to 1, is preferably greater than 1, and is less than 10, e.g. about 4. Further, were C is the value of the feedback capacitor, the quantity 1/R2C is preferably chosen to lie between 100 and 1000 rad/s, e.g. about 400 rad/s.

FIG. 4 illustrates schematically the frequency spectrum of the signals generated in the carrier recovery circuit in accordance with FIG. 1. For obvious practical reasons, the same frequency scale has not been used in every case and the difference $F-F_0$ is exaggerated.

The frequency spectrum of the signal SL is shown at (a). Since this example concerns a case of vestigial sideband modulation, the sidebands of the modulated signal are not, in fact, symmetrical about a vertical axis passing through the frequency $F_0$ of the modulation carrier, but they may be considered to be symmetrical after filtering by the filter PBO which limits the spectrum to the neighbourhood of the frequency $F_0$. The signal SL is thus constituted, as illustrated, by two symmetrical sidebands disposed about the carrier frequency. Both of these sidebands essentially comprise a succession of equally spaced frequency components. The lower sideband is shaded.

The transposition of the signal SL by the wave OT11 is shown at (b). The 2F frequency component of the wave OT11 is shown dotted as is the upper modulation component which is removed by the low pass filter PB11. Full lines are used only for the frequency spectrum of the signal S11 i.e. the lower modulation component. This frequency spectrum is an image of the frequency spectrum of the signal SL, with inversion about the carrier frequency and a shift of $2(F-F_0)$.

It has been observed experimentally that the local oscillator latches onto a frequency such that the frequency spectra of the signals SL and S11 coincides (apart from the inversion), i.e. onto the frequency $F_0$ of the modulation carrier, and that there are two phase shifts differing by $\pi$ radians (to within $2\pi$) for which the loop is in stable equilibrium.

To explain such operation we will consider the simplified case in which the frequency spectrum of the signal SL used to control the phase-locked loop includes only one frequency component of amplitude B and at $\pm f_0$ from the carrier which is of amplitude A. The signal SL is of the form:

$$SL = A\cos[2\pi F_0 t + \phi'] + B\cos[2\pi(F_0 - f_0)t - b + \phi'] + B\cos[2\pi(F_0 + f_0)t + b + \phi']$$

where $+b$ and $-b$ are the respective phase shifts from the modulation carrier of the two components of the signal SO, and $\phi'$ is the phase shift introduced by the band pass filter for limiting the bandwidth of the modulated signal. All phase-shifts are given modulo $2\pi$.

Since the local carrier delivered by the local oscillator has the form $\cos(2\pi Ft + \phi)$, the transposition wave OT11 may be written:

$$OT11 = \cos 2(2\pi Ft + \phi).$$

The signal S11 constituted by the lower modulation component as selected by the low pass filter PB11 can thus be written:

$$S11 = \frac{A}{2} \cos[2\pi(2F_0 - F_0)t + 2\phi - \phi' + \phi_1'']$$

$$+ \frac{B}{2} \cos[2\pi(2F - F_0 + f_0)t + 2\phi + b - \phi' + \phi_1'']$$

$$+ \frac{B}{2} \cos[2\pi(2F - F_0 - f_0)t + 2\phi - b - \phi' + \phi_1'']$$

where $\phi_1''$ is the phase shift introduced by the low pass filter PB11.

The lower sideband S'12 of the signal S12 obtained at the output of the phase discriminator can be written:

$$S'12 = \left[\frac{A^2}{4} + \frac{B^2}{2}\right]\cos[2\pi(2F - 2F_0)t + 2\phi - 2\phi' + \phi_1'']$$

$$+ \frac{AB}{2} \cos[2\pi(2F - 2F_0 + f_0)t + 2\phi + b - 2\phi' + \phi_1'']$$

$$+ \frac{AB}{2} \cos[2\pi(2F - 2F_0 - f_0)t + 2\phi - b - 2\phi' + \phi_1'']$$

$$+ \frac{B^2}{4} \cos[2\pi(2F - 2F_0 + 2f_0)t + 2\phi + 2b - 2\phi' + \phi_1'']$$

$$+ \frac{B^2}{4} \cos[2\pi(2F - 2F_0 - 2f_0)t + 2\phi - 2b - 2\phi' + \phi_1'']$$

i.e.

$$S'12 = \left[\frac{A^2}{4} + \frac{B^2}{2}\right]\cos[2\pi(2F - 2F_0)t + 2\phi - 2\phi' + \phi_1'']$$

$$+ AB \cos[2\pi(2F - 2F_0)t + 2\phi - 2\phi' + \phi_1''] \cdot \cos(2\pi f_0 t + b)$$

$$+ \frac{B^2}{2} \cos[2\pi(2F - 2F_0)t + 2\phi - 2\phi' + \phi_1''] \cdot \cos(4\pi f_0 t + 2b)$$

It will then be assumed that $\phi_a = 2\phi - 2\phi' + \phi_1''$

Since the loop filter is designed to pass not only a DC component but also the low-frequency components of the signal S12, an equilibrium point of the loop necessarily corresponds to a pair of values (F;$\phi_a$) which cancel S'12 (independently from t, of course).

It is easy to see that there are only two pairs of values (F;$\phi_a$) which satisfy this condition:

(F=F$_0$; $\phi_a=\pi/2$)

(F=F$_0$; $\phi_a=3\pi/2$)

It will be seen that for a given local oscillator one of these pairs corresponds to a point of stable equilibrium and the other corresponds to a point of unstable equilibrium. To show this, we will consider the operation of the system in the neighbourhood of these points of equilibrium after having rewritten the signal S12 in the form:

$$S'12 = \frac{A^2}{4} \cos[2\pi(2F - 2F_0)t + \phi_a]$$
$$+ AB \cos[2\pi(2F - 2F_0)t + \phi_a] \cdot \cos(2\pi f_0 t + b)$$
$$+ B^2 \cos[2\pi(2F - 2F_0)t + \phi_a] \cdot \cos^2(2\pi f_0 t + b)$$

In the neighbourhood of the first point of equilibrium (F=F$_0$, $\phi_a=\pi/2$) the signal can be written in the form:

$$S'12 = \frac{A^2}{4} \cos\left(\frac{\pi}{2} + d\phi\right) +$$
$$AB \cos\left(\frac{\pi}{2} + d\phi\right) \cdot \cos(2\pi f_0 t + b) +$$
$$B^2 \cos\left(\frac{\pi}{2} + d\phi\right) \cdot \cos^2(2\pi f_0 t + b)$$

i.e.

$$S'12 = -\frac{A^2}{4} \sin(d\phi)\left[1 + 4\frac{B}{A} \cos(2\pi f_0 t + b) + 4\frac{B^2}{A^2} \cos^2(2\pi f_0 t + b)\right]$$

It is easy to see that the term in square brackets is a perfect square and is never negative. It is only capable of cancelling for some discrete values of t. It follows that the signal S'12 is of opposite sign to that of the variations $d\phi$. If an oscillator is used whose frequency variations are of the same sign as the applied control signal, the first point of equilibrium considered is a point of stable equilibrium.

In the neighborhood of the second point of equilibrium (F=F$_0$; $\phi_a=3\pi 2$) the signal S'12 can be written in the form:

$$S'12 = \frac{A^2}{4} \cos\left(\frac{3\pi}{2} + d\phi\right) +$$
$$AB \cos\left(\frac{3\pi}{2} + d\phi\right) \cdot \cos(2\pi f_0 t + b) +$$
$$B^2 \cos\left(\frac{3\pi}{2} + d\phi\right) \cdot \cos^2(2\pi f_0 t + b)$$

i.e.

$$S'12 = \frac{A^2}{4} \sin(d\phi)\left[1 + \frac{4B}{A} \cos(2\pi f_0 t + b) +\right.$$

$$\left. 4\frac{B^2}{A^2} \cos^2(2\pi f_0 t + b)\right]$$

Reasoning as previously, we deduce that the signal S12 is of the same sign as the variation $d\phi$. If, as previously described, we use an oscillator whose frequency variations are of the same sign as the applied control signal, the second point of equilibrium is a point of unstable equilibrium. If, in contrast, we use an oscillator whose frequency variations are of opposite sign to that of the applied control signal, the second point of equilibrium is stable but the first is unstable.

Let us consider for example that we are using an oscillator whose frequency variations are of the same sign as the applied control signal. The phase locked loop therefore has a point of stable equilibrium (F=F$_0$; $\phi_a=\pi/2$) which corresponds in fact, to one of the two following values for the phase shift $\phi$ of the local carrier generated by the local oscillator from the modulation carrier $$\phi=(\pi/4)+\phi'-\tfrac{1}{2}\phi_1'' \text{ and } \phi=(\pi/4)+\phi'-\tfrac{1}{2}\phi_1''+\pi$$

To allow the modulated signal to be demodulated synchronously, the modulator 8 which performs the demodulation must receive a carrier which is in phase with the modulation carrier. The local carrier delivered by the local oscillator OL must be phase shifted before being applied to the modulator. This is done by the phase shifter assembly ED, which includes a switchable $\pi$ radian phase shifter 10 followed by an adjustable phase shifter 12, together with a control circuit 11 which controls the $\pi$ phase shifter on the basis of the output signal from the modulator 8.

The adjustable phase shifter, which is manually adjustable for example, is used to compensate the $(\pi/4)+\phi'-\tfrac{1}{2}\phi_1''$ term which occurs in both values of $\phi$ for which the loop can be in equilibrium, thereby bringing the phase shift (a) of the demodulation carrier with respect to the modulation carrier to a value of 0 or $\pi$. The $\pi$ radian phase shifter automatically brings the phase shift (a) to 0 under the control of the control circuit 11. To do this the control circuit of the $\pi$ radian phase shifter comprises a low-pass filter 14 which selects the DC component of the output signal from the modulator 8, followed by a sign detect 16 which receives the DC component and which, as a function of the − sign or + sign which it detects, causes a phase shift of $\pi$ radians to be switched in or out of the carrier delivered by the local oscillator. Indeed, it is easy to see that the form of said DC component is Acos(a) where A is the amplitude of the carrier in the original modulated signal; it is therefore negative or positive according to whether (a)=$\pi$ or 0 and hence according to whether or not it is necessary to shift the phase by $\pi$. The demodulated signal appears at the output of a low-pass filter 18 supplied by the modulator 8.

In a variant, the $\pi$ radian phase shifter can be placed in the phase locked loop itself, at the output of the local oscillator.

It will be observed that in some cases other than that considered here, in which the modulating signal is a television signal, i.e. a signal which has a non-zero DC component, the phase shift (a) can be optionally equal to 0 or $\pi$. This is the case for example of signals whose average component is zero.

The π radian phase shifter and its control circuit are then of course useless and it is not necessary for the modulated signal to include a vestigial carrier. Indeed, it has been observed that a recovery circuit in accordance with the invention allows the frequency and the phase of the modulation carrier to be recovered to within π even when there is no vestigial carrier in the modulated signal; this is explained on referring back to the simplified case previously seen: the fact of cancelling A, the amplitude of the carrier, does not change the result for loop equilibrium.

FIG. 2 illustrates a second embodiment of the invention. Its frequency need not be as high as 2F. In the carrier recovery circuit illustrated here, the local carrier generated by the local oscillator is applied to an auxiliary modulator 22 which also receives an auxiliary wave of frequency $f_2 = F/N_2$, delivered by a frequency divider 24 which itself receives the local carrier. The output of the auxiliary modulator is connected to the respective inputs of two filters one of which PB21 is a low-pass filter and selects the low-frequency component OT21 and the other of which PH21 is a high-pass filter and selects the high-frequency component OT22 which comes from the auxiliary modulator.

The narrow bandwidth signal SL is transposed successively by the waves OT21 and OT22 by applying it to a first modulator M21 which also receives the transposition wave OT21. A low-pass filter PB22 placed at the output of the first modulator selects the lower modulation band and delivers a signal S21 which is applied to a second modulator M22 which also receives the transposition wave OT22. A low-pass filter PB23 placed at the output of the second modulator selects the lower modulation band S22.

A phase discriminator D2 produces beats between the signal SL and the signal S22 and applies the beat signal, i.e. S23, to the loop filter FB whose output signal controls the local oscillator OL.

The loop filter may be analagous to that of the recovery circuit of FIG. 1.

The ratio $N_2$ in which the frequency of the local carrier is divided to obtain the frequency $f_2$ is chosen in such a way that the frequency $(F+f_2)$ of the transposition wave OT22 is always higher than the highest frequency contained in the narrow bandwidth modulated signal SL and so that the frequency $(F-f_2)$ of the transposition wave OT21 is always lower than the lowest frequency contained in this signal. By way of indication, in the numerical example considered, the frequency $f_2$ can be in the order of few hundreds of kilohertz. It will be observed that in a variant, it is possible to use an auxiliary oscillator of frequency $f_2$ to generate the auxiliary wave instead of the frequency divider illustrated in FIG. 2.

FIG. 5 illustrates schematically the signals which pass through the carrier recovery circuit illustrated in FIG. 2.

(a) illustrates the signal SL. (b) illustrates the transposition of the signal SL by the wave OT21. The frequency component of the wave OT21 at the frequency $F-f_2$ is shown in dashed lines as is the upper modulation sideband eliminated by the low-pass filter PB22. The figure also shows in broken lines the symmetrical frequency spectrum of the signal of the upper modulation sideband with respect to the frequency component of the transposition wave, which is at the negative frequency end and which, by inversion about the zero frequency axis, supplies the frequency spectrum of the lower modulation sideband selected by the low-pass filter PB22. Only the latter frequency spectrum is illustrated in solid lines.

The transposition of the lower sideband of the first modulation by the wave OT22, obtained at the output of the filter PB22, is illustrated at (c). The spot frequency of the wave OT22 at the frequency $F+f_2$ is illustrated in dashed lines as is the frequency spectrum of the upper sideband of the second modulation. The frequency spectrum of the corresponding lower sideband which constitutes the signal S22 is the only one illustrated in solid lines. This frequency spectrum is an image of that of the signal SL and is shifted from the frequency spectrum by $2(F-F_0)$ with inversion about the spot frequency which corresponds to the modulation carrier; it is identical to that of the signal S11 which is generated in the recovery circuit illustrated in FIG. 1 and which is illustrated at 4(b).

As in the case of the circuit illustrated in FIG. 1, the local oscillator latches onto a frequency value which to within an inversion makes the frequency spectra of the signals SL and S22 coincide, i.e. to the value of the frequency $F_0$ of the modulation carrier and there are two values which differ by π (to within 2π) of the phase shift φ of the carrier generated by the local oscillator from the modulation carrier and at which the loop is in stable equilibrium.

To explain this operation, we can consider the same simplified case as previously. These calculations then lead, in the case of the lower sideband of the signal S23, to an expression which is completely analogous to that found for the lower sideband of the signal S12.

The phase shifter assembly through which the carrier generated by the local oscillator is applied to the modulator which demodulates the original modulated signal performs the same function as the phase shifter assembly of the demodulator illustrated in FIG. 1 and it is constituted in a completely analagous way.

It will be observed that it is possible in a variant of the second embodiment of the invention to reverse the order in which the two successive transpositions of the signal SL are carried out. The signal SL is then transposed by the wave OT22 which is of frequency $(F+f_2)$ and the lower sideband of the first modulation is then transposed by the wave OT21 which is of frequency $(F-f_2)$. The phase discriminator produces beats between the signal SL and the upper sideband of the second modulation.

Further, although it is less advantageous to do so since this leads to the use of higher frequencies, it is possible to choose a value higher than that of the frequency F for the frequency $f_2$ (for $f_2 = F$, we find the first embodiment). In this case, effecting a transposition by a wave at the frequency $F = f_2$ and selecting the lower or upper modulation sideband would in practice be equivalent to effecting a transposition by a wave at the frequency $-(F-f_2)$ and selecting the upper or lower modulation sideband.

FIG. 3 illustrates the third embodiment of the invention. As in the carrier recovery circuit illustrated in FIG. 2, the local carrier generated by the local oscillator OL is applied to an auxiliary modulator 32 which also receives an auxiliary wave, here of frequency $f_3 = F/N_3$, delivered by a frequency divider 34 which itself receives the local carrier. The output of the auxiliary modulator 34 is connected to the respective inputs of two filters one of which PB31, is a low-pass filter and selects the low-frequency component, i.e. OT31 and the other of which, PH31, is a high-pass filter and selects the high-frequency component, i.e. OT32, these components coming from the auxiliary modulator.

The narrow bandwidth signal SL is here transposed twice in parallel by the waves OT31 and OT32 respectively. For this purpose, it is applied both to a first modulator M31 which also receives the transposition wave OT31 and to a second modulator M32 which also receives the transposition wave OT32. Two low-pass filters PB32 and PB33 placed at the outputs of the first and second modulators respectively select the lower modulation bandwidths. A phase discriminator D3 produces beat between the two signals delivered by the filters PB32 and PB33, i.e. S31 and S32 respectively. The signal S33 which results from the beat is applied via a loop filter FB to control the local oscillator.

The loop filter can be analogous to that of the recovery circuit illustrated in FIG. 1.

The ratio $N_3$ by which the frequency of the local carrier is divided to obtain the frequency $f_3$ is chosen in the same way as the ratio $N_2$ and the frequency $f_3$, like the frequency $f_2$, can be in the order of a few hundreths of kilohertz in the numerical example considered. In a variant, the divider by $N_3$ can be replaced by an auxiliary oscillator of frequency $f_3$, independent from the local oscillator of frequency F.

FIG. 6 illustrates schematically the signals which pass through the carrier recovery circuit illustrated in FIG. 3.

(a) again illustrates the signal SL. (b) illustrates the transposition of the signal SL by the wave OT31, which is completely analogous to the transposition of the signal SL by the wave OT21. Dashed lines are used to show the spot frequency of the wave OT31 at the frequency $(F-f_3)$, the frequency spectrum of the upper modulation sideband as removed by the low-pass filter PB32, and the symmetrical frequency spectrum thereof about the frequency of the transposition wave. This spectrum is on the negative frequency side of the zero frequency axis and by inversion thereabout supplies the frequency spectrum of the lower modulation sideband that is selected by the low-pass filter PB32. Only this last frequency spectrum, which is that of the signal S31, is shown in solid lines.

The transposition of the signal SL by the wave OT32 is illustrated at (c). The spot frequency of the wave OT32 of frequency $(F+f_3)$, as well as the frequency spectrum of the upper modulation sideband as removed by low-pass filter PB33, are shown in broken lines, while the frequency spectrum of the lower modulation sideband selected by the filter PB33 is shown in solid lines. This last frequency spectrum is that of the signal S32.

The frequency spectra of the signals S31 and S32 are both images of the frequency spectrum of the signal SL and they are shifted from each other by $$F+f_3-F_0+F-f_3-F_0=2(F-F_0)$$

to within one inversion about the spot frequency which is an image of the frequency of the modulation carrier in one of these two image spectra.

Here again, the local oscillator latches onto a frequency which (to within one inversion) makes the frequency spectra of the signals S31 and S32 coincide. The signals S31 and S32 are made to beat together i.e. at the frequency $F_0$ of the modulation carrier and the loop is in stable balance at two values which differ by $\pi$ between the carrier generated by the local oscillator and the modulation carrier.

Taking once again the simplified case which has been seen previously, calculations lead, for the lower sideband of the signal S33, to an expression of the same type as that found for the lower sideband of the signal S12.

The phase shifter assembly ED has a similar constitution to that of the phase shifter assembly of the demodulator of FIG. 1.

As in the case of the frequency $f_2$ in the second embodiment, here, a value higher than that of the frequency F (for $f_3=F$, we find again the first embodiment) can be chosen for the frequency $f_3$; effecting a transposition by a wave at the frequency $F-f_3$ and selecting the lower modulation sideband would then be equivalent in practice to effecting a transposition by a wave at the frequency $-(F-F_3)$ and selecting the upper modulation sideband.

We claim:
1. A method of recovering the modulation carrier wave of a modulated signal whose frequency spectrum includes components whose frequencies are symmetrical in pairs about the carrier frequency, said method including the following operations:
   generating a local carrier (F) at a controllable frequency;
   deriving, where necessary, an "original" signal (SL) from the said modulated signal, such that the frequency spectrum of the original signal is constituted substantially entirely by a frequency component at the carrier frequency and modulation components arranged symmetrically in pairs about the carrier frequency;
   using the local carrier in conjunction with modulation means and filtering means to generate two image signals from the "original" signal such that the frequency spectrum of one of the image signals is inverted about its central frequency with respect to the frequency spectrum of the other of the image signals, and such that the frequency difference between the central frequencies of the image signals is proportional to the frequency difference between the frequency of the local carrier and the frequency of the modulation carrier;
   performing a step of phase discrimination between the said image signals; and
   controlling the frequency of the local carrier by the signal which results from the discrimination after removal of the high frequencies.

2. A method according to claim 1, wherein one of the two image signals is constituted by the original signal (SL) itself; and the other image signal is obtained by the following operations:
   the local carrier (F) is modulated by itself to obtain a double frequency (2F) transposition wave;
   the original signal (SL) is modulated by the transposition wave; and
   the signal thus obtained is filtered to retain only the difference modulation component.

3. A method according to claim 1, wherein one of the image signals is constituted by the original signal (SL) itself; and
   the other image signal is obtained by the following operations:
   generating two transposition waves whose frequencies $(F+f_2, F-f_2)$ are symmetrical about the frequency of the local carrier (F) and sufficiently spaced apart therefrom to be on either side of the frequency spectrum of the original signal (SL); and modulating the original signal in series by these two transposition waves, each of these two modulations being followed by filtering which allows only one of the two modulation sidebands to remain so as to obtain, after modulating twice and filtering twice, an image signal whose frequency spectrum is inverted with respect to the spectrum of the original signal and shifted from this spectrum by twice the difference between the frequency of the local carrier and the frequency of the modulation carrier.

4. A method according to claim 1, wherein the two image signals are obtained by the following operations:

generating two transposition waves whose frequencies ($F+f_3$, $F-f_3$) are symmetrical about the frequency of the local carrier (F) and sufficiently spaced apart therefrom to be on either side of the frequency spectrum of the original signal (SL); and modulating the original signal in parallel by the two transposition waves, each of these two modulations being followed by filtering which allows only one of the two modulation sidebands to remain to constitute an image signal, the chosen modulation sidebands being such that the frequency spectrum of the two image signals thus obtained are inverted with respect to each other and shifted apart from each other by twice the distance between the frequency of the local carrier and the frequency of the modulation carrier.

5. A method according to claim 1, wherein the modulated signal results from a vestigial sideband amplitude modulation, and the original signal is derived from the modulated signal by filtering the modulation signal with a band-pass filter so as to limit its frequency spectrum to a zone in which it is substantially symmetrical about the frequency of the modulation carrier.

6. A method according to claim 1, including a further step of performing a phase shift of adjustable magnitude on the local carrier (F).

7. A method according to claim 6, wherein said phase shift includes a switchable phase inversion.

8. A method according to claim 1, further including the steps of:
modulating the modulated signal by the local carrier which has undergone the phase shift; and
filtering the signal which results from this modulation by a low-pass filter; and
controlling said phase inversion by the signal which results from the filtering.

9. A method according to any one of claims 1 to 8, applied to an original signal which has a succession of equidistant frequency components.

10. A device for recovering the modulation carrier wave of a modulated signal whose frequency spectrum includes components whose frequencies are symmetrical in pairs about the carrier frequency, the device including:
a local oscillator to generate a local carrier of controllable frequency (F);
means for deriving, where necessary, an "original" signal (SL) from the said modulated signal, such that the frequency spectrum of the original signal is constituted substantially entirely by a frequency component at the carrier frequency and modulation components arranged symmetrically in pairs about the carrier frequency;

modulation means and filter means which receive both the local carrier (F) and the said original signal (SL) to generate two image signals of the "original" signal such that the frequency spectrum of one of the image signals is inverted about its central frequency with respect to the frequency spectrum of the other of the image signals, and such that the frequency difference between the central frequencies of the image signals is proportional to the frequency difference between the frequency of the local carrier and the frequency of the modulation carrier;
a phase discriminator to make a phase discriminator between the two image signals; and
a band filter to pass only the low frequencies of the output signal of the phase discriminator and to apply said low frequency signal to control the frequency of the local oscillator.

11. A device according to claim 10, wherein said modulation and filter means include:
a frequency doubler which receives the local carrier and supplies a transposition wave of double frequency (2F);
a modulator which modulates the original signal (SL) by means of the transposition wave; and
a low-pass filter which filters the output signal of the modulator to retain only the difference modulation component;
one of said two image signals being constituted by the original signal (SL) itself and the other signal being constituted by said difference component.

12. A device according to claim 10, wherein said modulation and filter means include:
a transposition wave generator to generate two transposition waves whose frequencies ($F+f_2$, $F-f_2$) are symmetrical about the frequency of the local carrier (F) and sufficiently spaced apart therefrom to be on either side of the frequency spectrum of the original signal (SL);
two modulators to modulate the original signal in series by means of these transposition waves, each of these modulators being provided at its output with a filter which allows only one of the two modulation sidebands to remain, so as to obtain an image signal whose frequency spectrum is inverted with respect to the original signal frequency spectrum and shifted therefrom by twice the distance between the frequency of the local carrier and the frequency of the modulation carrier;
the other image signal being constituted by the original signal itself.

13. A device according to claim 10, wherein said modulation and filter means include:
a transposition wave generator to generate two transposition waves whose frequencies ($F-f_3$, $F+f_3$) are symmetrical about the frequency of the local carrier (F) and sufficiently spaced apart therefrom to be on either side of the frequency spectrum of the original signal (SL);
two modulators to modulate the original signal in parallel by means of these two transposition waves, each of these modulators being provided at its output with a filter which allows only one of the two modulation sidebands to remain, each of the two remaining sidebands constituting one of said image signals; so that the spectra of the two image signals thus obtained are inverted with respect to each other and shifted apart by twice the distance between the frequency of the local carrier and the frequency of the modulation carrier.

14. A device according to claim 10, wherein said band filter is constituted by an operational amplifier 6 connected as a low-pass filter and equipped for this purpose with a generator impedance of value R1 and a feedback impedance formed by a capacitor of capacity C in series with a resistor of value R2, the ratio R2/R1 lying between 1 and 10, the expression 1/CR2 lying between 100 and 1000 rad/s.

15. A device according to claim 14, wherein said ratio is substantially equal to 4, and said expression is substantially equal to 400 rad/s.

* * * * *